United States Patent
Tanaka et al.

(10) Patent No.: US 10,283,632 B2
(45) Date of Patent: May 7, 2019

(54) NITRIDE SEMICONDUCTOR DEVICE AND MANUFACTURING METHOD THEREOF

(71) Applicant: ROHM CO., LTD., Kyoto (JP)

(72) Inventors: Taketoshi Tanaka, Kyoto (JP); Norikazu Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/285,586

(22) Filed: Oct. 5, 2016

(65) Prior Publication Data

US 2017/0104092 A1 Apr. 13, 2017

(30) Foreign Application Priority Data

Oct. 8, 2015 (JP) .................. 2015-200414

(51) Int. Cl.
| | |
|---|---|
| *H01L 29/778* | (2006.01) |
| *H01L 29/205* | (2006.01) |
| *H01L 29/20* | (2006.01) |
| *H01L 29/40* | (2006.01) |
| *H01L 29/66* | (2006.01) |
| *H01L 29/06* | (2006.01) |
| *H01L 21/02* | (2006.01) |

(52) U.S. Cl.
CPC .... *H01L 29/7787* (2013.01); *H01L 21/02271* (2013.01); *H01L 29/0649* (2013.01); *H01L 29/2003* (2013.01); *H01L 29/205* (2013.01); *H01L 29/404* (2013.01); *H01L 29/66462* (2013.01)

(58) Field of Classification Search
CPC .............. H01L 29/66431; H01L 29/66462
See application file for complete search history.

(56) References Cited

U.S. PATENT DOCUMENTS

| | | | | |
|---|---|---|---|---|
| 9,954,087 B2* | 4/2018 | Inoue | ............... | H01L 29/155 |
| 2007/0170463 A1* | 7/2007 | Ueno | ............... | H01L 29/1066 |
| | | | | 257/192 |
| 2009/0045439 A1* | 2/2009 | Hoshi | ............... | H01L 29/7787 |
| | | | | 257/194 |
| 2010/0155720 A1* | 6/2010 | Kaneko | ............... | H01L 29/2003 |
| | | | | 257/43 |

(Continued)

FOREIGN PATENT DOCUMENTS

JP 2013-065612 A 4/2013

*Primary Examiner* — Benjamin P Sandvik

(57) ABSTRACT

A nitride semiconductor device includes: an electron transit layer formed of GaN; an electron supply layer formed on the electron transit layer and to which tensile strain is applied by the electron transit layer, the electron supply layer being formed as an $Al_xIn_yGa_{1-x-y}N$ layer where $0.8 \le x \le 1.0$ and $0 \le x+y \le 1$; a passivation film formed on the electron supply layer and formed of SiN, the passivation film having an opening part extending to the electron supply layer; a gate electrode formed on the electron supply layer through a gate insulating film formed within the opening part; and a source electrode and a drain electrode disposed away from the gate electrode to have the gate electrode interposed therebetween, the source electrode and the drain electrode being electrically connected to the electron supply layer. A film thickness of the passivation film is 10 nm or greater.

14 Claims, 14 Drawing Sheets

(56) References Cited

U.S. PATENT DOCUMENTS

| | | | | |
|---|---|---|---|---|
| 2012/0049243 A1* | 3/2012 | Wu | ............... | H01L 29/402 |
| | | | | 257/194 |
| 2014/0264451 A1* | 9/2014 | Ozaki | ............... | H01L 29/513 |
| | | | | 257/194 |
| 2014/0353720 A1* | 12/2014 | Inoue | ............... | H01L 29/7827 |
| | | | | 257/192 |
| 2015/0028390 A1* | 1/2015 | Colino | ............... | H01L 29/7786 |
| | | | | 257/194 |

* cited by examiner

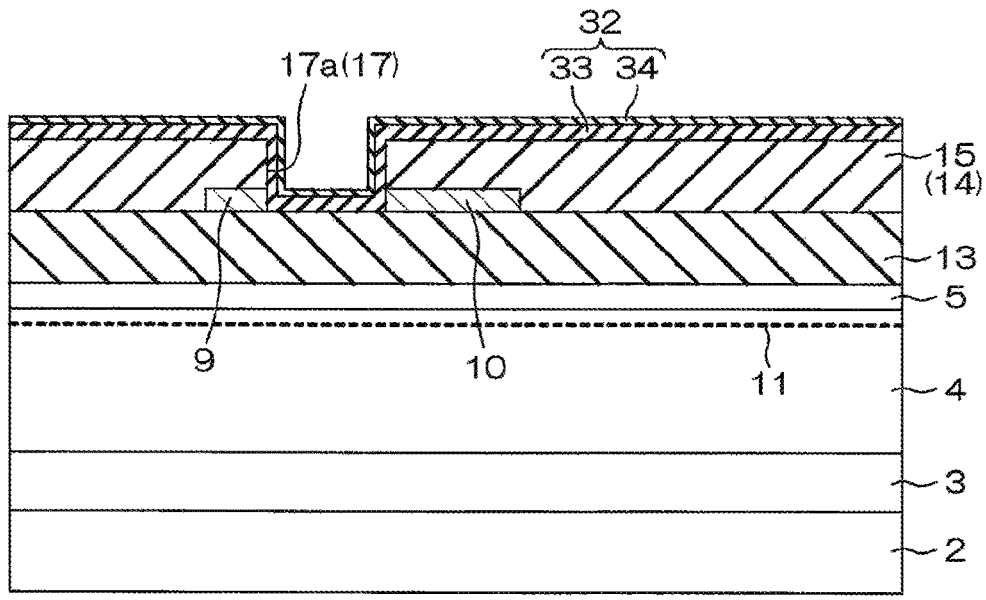
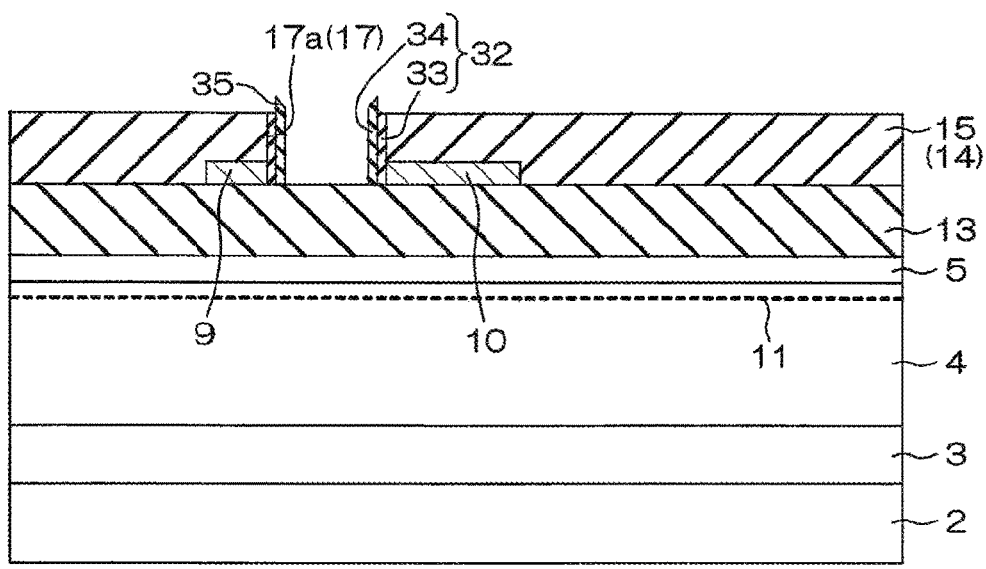

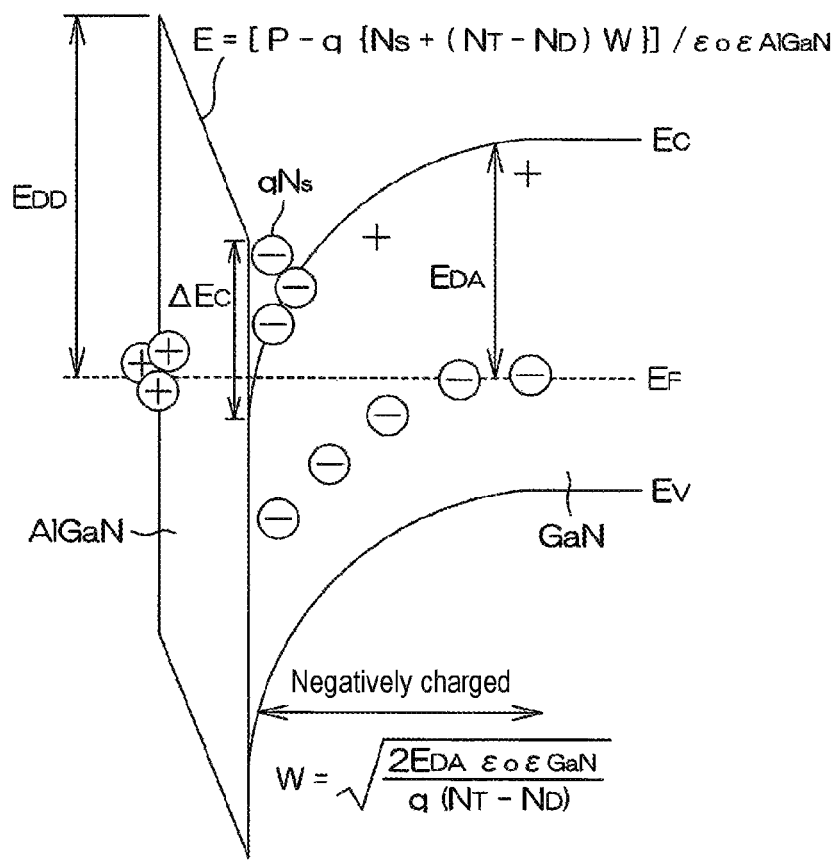

NITRIDE SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2015-200414, filed on Oct. 8, 2015, the entire contents of which are incorporated herein by reference.

TECHNICAL FIELD

The present disclosure relates to a nitride semiconductor device including a group-III nitride semiconductor (hereinafter, simply referred to as a "nitride semiconductor"), and a manufacturing method thereof.

BACKGROUND

A group-III nitride semiconductor is a semiconductor using nitrogen as a group-V element in group III-V semiconductors. An aluminum nitride (AlN), a gallium nitride (GaN), and an indium nitride (InN) are typical examples of the group-III nitride semiconductor. In general, the group-III nitride semiconductor may be expressed as $Al_xIn_yGa_{1-x-y}N$ (where $0 \leq x \leq 1$, $0 \leq y \leq 1$, and $0 \leq x+y \leq 1$).

A high electron mobility transistor (HEMT) using such a nitride semiconductor has been proposed. The HEMT includes, for example, an electron transit layer made of GaN and an electron supply layer made of AlGaN epitaxially grown on the electron transit layer. A pair of source electrode and drain electrode is formed to be in contact with the electron supply layer, and a gate electrode is disposed therebetween. The gate electrode is disposed to face the electron supply layer with an insulating film disposed therebetween. Due to the polarization caused by the lattice mismatch of GaN and AlGaN, a two-dimensional (2D) electron gas is formed in an inward position by a few Å from an interface between the electron transit layer and the electron supply layer, within the electron transit layer. The source and the drain are connected through the 2D electron gas as a channel. When the 2D electron gas is blocked by applying a control voltage to the gate electrode, the source and the drain are disconnected from each other. In a state where the control voltage is not applied to the gate electrode, the source and the drain are conducted such that a normally ON type device is formed.

Since a device using a nitride semiconductor has the characteristics such as a high voltage, a high temperature operation, a large current density, high speed switching, and a low on-resistance, applications to power devices have been studied.

However, in order to be used as a power device, since it is required to be a normally OFF type device in which a current is cut off at the time of zero biasing, the aforementioned HEMT cannot be applied to the power device.

A structure for realizing a normally OFF type nitride semiconductor HEMT has been proposed. Specifically, an oxide film having a continuous interface from an interface between an electron supply layer and an electron transit layer is formed on the electron transit layer. Further, a gate electrode faces the electron transit layer with the oxide film interposed therebetween. In this configuration, since the electron supply layer is not present directly below the gate electrode, a 2D electron gas is not formed directly below the gate electrode. Thus, a normally OFF is achieved. The oxide film is created by, for example, thermally oxidizing a portion of the electron supply layer.

In a nitride semiconductor device having an oxide film directly below a gate electrode, an AlN layer may be used as an electron supply layer for the reason that the oxide film is easily created. However, when the AlN layer is used as the electron supply layer, the polarization caused by the lattice mismatch between the electron transit layer and the electron supply layer is so strong that a concentration of the 2D electron gas generated within the electron transit layer may be excessively high. The excessively high concentration of the 2D electron gas generated within the electron transit layer may cause an adverse effect such as a degradation of withstanding voltage of the nitride semiconductor device, an increase in a leakage current, an increase in capacity, etc. This problem may also arise in a case where a nitride semiconductor layer having a high Al composition is used as the electron supply layer, as well as in a case where the AlN layer is used as the electron supply layer.

SUMMARY

The present disclosure provides some embodiments of a nitride semiconductor device in which a concentration of a 2D electron gas can be appropriately lowered in a case where an $Al_xIn_yGa_{1-x-y}N$ layer (where $0.8 \leq x \leq 1.0$ and $0 \leq x+y \leq 1$) is used as an electron supply layer, and a manufacturing method thereof.

According to one embodiment of the present disclosure, there is provided a nitride semiconductor device, including: an electron transit layer formed of GaN; an electron supply layer formed on the electron transit layer and to which tensile strain is applied by the electron transit layer, the electron supply layer being formed as an $Al_xIn_yGa_{1-x-y}N$ layer where $0.8 \leq x \leq 1.0$ and $0 \leq x+y \leq 1$; a passivation film formed on the electron supply layer and formed of SiN, the passivation film having an opening part extending to the electron supply layer; a gate electrode formed on the electron supply layer through a gate insulating film formed within the opening part; and a source electrode and a drain electrode disposed away from the gate electrode to have the gate electrode interposed therebetween, the source electrode and the drain electrode being electrically connected to the electron supply layer, wherein a film thickness of the passivation film is 10 nm or greater.

A coefficient of thermal expansion of GaN forming the electron transit layer and a coefficient of thermal expansion of SiN forming the passivation film are almost the same, while a film-forming temperature of SiN is higher than that of GaN. Therefore, after forming the passivation film, when the passivation film returns to room temperature, the SiN forming the passivation film shrinks, compared with the GaN forming the electron transit layer. Thus, the passivation film applies compressive stress (compressive strain) to the electron supply layer and the electron transit layer. As a result, since the piezoelectric polarization generated in the electron supply layer is reduced, it is possible to appropriately lower the concentration of the 2D electron gas generated within the electron transit layer.

According to another embodiment of the present disclosure, there is provided a nitride semiconductor device, including: an electron transit layer formed of GaN; an electron supply layer formed on the electron transit layer and to which tensile strain is applied by the electron transit layer, the electron supply layer being formed as an $Al_xIn_yGa_{1-x-y}N$ layer where $0.8 \leq x \leq 1.0$ and $0 \leq x+y \leq 1$; a passivation film formed on the electron supply layer and formed of SiN, the passivation film having an opening part extending to the electron supply layer; a gate electrode formed on the electron supply layer through a gate insulating film formed within the opening part; a source electrode and a drain electrode disposed away from the gate electrode to have the gate electrode interposed therebetween, the source electrode and the drain electrode being electrically connected to the electron supply layer; and a field plate configured to alleviate concentration of an electric field on the gate electrode, wherein, if an output capacity Coss when a drain voltage is 0V is set as a reference output capacity Cosso, a drain voltage whose output capacity Coss is ½ of the reference output capacity Cosso is 20V or lower.

A coefficient of thermal expansion of GaN forming the electron transit layer and a coefficient of thermal expansion of SiN forming the passivation film are almost the same, while a film-forming temperature of SiN is higher than that of GaN. Thus, after forming the passivation film, when the passivation film returns to room temperature, the SiN forming the passivation film shrinks, compared with the GaN forming the electron transit layer. Thus, the passivation film applies compressive stress to the electron supply layer and the electron transit layer. As a result, since the piezoelectric polarization generated in the electron supply layer is reduced, it is possible to appropriately lower the concentration of the 2D electron gas generated within the electron transit layer.

When a drain voltage is applied, since a concentration of the 2D electron gas directly below the field plate is reduced, the output capacity Coss is reduced. As the concentration of the 2D electron gas generated within an electron transit layer is higher, the output capacity Coss is difficult to reduce. Thus, as the concentration of the 2D electron gas generated within the electron transit layer is higher, a drain voltage whose output capacity Coss is ½ of a reference output capacity Cosso is increased. When compressive strain of a predetermined level or higher is not applied to the electron supply layer by the passivation film, since the concentration of the 2D electron gas is excessively increased, the drain voltage whose output capacity Coss is ½ of the reference output capacity Cosso becomes higher than 20V. In this configuration, the compressive strain of a predetermined level or higher is applied to the electron supply layer by the passivation film, and thus, the concentration of the 2D electron gas is appropriately lowered, thereby allowing the drain voltage whose output capacity Coss is ½ of the reference output capacity Cosso to be 20V or lower.

According to still another embodiment of the present disclosure, there is provided a nitride semiconductor device, including: an electron transit layer formed of GaN; an electron supply layer formed on the electron transit layer and to which tensile strain is applied by the electron transit layer, the electron supply layer being formed as an $Al_xIn_yGa_{1-x-y}N$ layer where $0.8 \leq x \leq 1.0$ and $0 \leq x+y \leq 1$; a passivation film formed on the electron supply layer and formed of SiN, the passivation film having an opening part extending to the electron supply layer; a gate electrode formed on the electron supply layer through a gate insulating film formed within the opening part; and a source electrode and a drain electrode disposed away from the gate electrode to have the gate electrode interposed therebetween, the source electrode and the drain electrode being electrically connected to the electron supply layer, wherein a gate length is 1 μm or smaller.

A coefficient of thermal expansion of GaN forming the electron transit layer and a coefficient of thermal expansion of SiN forming the passivation film are almost the same, while a film-forming temperature of SiN is higher than that of GaN. Thus, after forming the passivation film, when the passivation film returns to room temperature, the SiN forming the passivation film shrinks, compared with the GaN forming the electron transit layer. Therefore, the passivation film applies compressive stress to the electron supply layer and the electron transit layer. As a result, since the piezoelectric polarization generated in the electron supply layer is reduced, it is possible to appropriately lower the concentration of the 2D electron gas generated within the electron transit layer.

When the compressive strain of a predetermined level or higher is not applied to the electron supply layer by the passivation film, the concentration of the 2D electron gas is excessively increased. Therefore, the gate length is required to be greater than 1 μm in order to maintain withstanding voltage. In this configuration, the compressive strain of a predetermined level or higher is applied to the electron supply layer by the passivation film, thereby appropriately lowering the concentration of the 2D electron gas. Thus, the gate length is 1 μm or smaller.

In some embodiments, the electron supply layer is formed as an AlN layer.

In some embodiments, the electron transit layer is formed as a GaN layer.

In some embodiments, the passivation film is formed through a thermal CVD method.

In some embodiments, the electron supply layer includes an oxide film formed in a lower portion of the opening by oxidation of the electron supply layer.

In some embodiments, a film thickness of the electron supply layer is 1.5 nm or greater.

In some embodiments, the passivation film is formed within a film forming apparatus for forming the electron transit layer.

In some embodiments, the device further includes a source field plate disposed near the gate electrode on the passivation film, and electrically connected to the source electrode.

In some embodiments, the field plate is a source field plate disposed near the gate electrode on the passivation film, and electrically connected to the source electrode.

According to still another embodiment of the present disclosure, there is provided a method of manufacturing a nitride semiconductor device, including: forming an electron transit layer formed of GaN; forming an electron supply layer formed as an $Al_xIn_yGa_{1-x-y}N$ layer (where $0.8 \leq x \leq 1.0$ and $0 \leq x+y \leq 1$) on the electron transit layer, and to which tensile strain is applied by the electron transit layer; forming a passivation film formed on the electron supply layer and formed of SiN through a thermal CVD method; forming an insulating layer on the passivation film; forming a gate opening part extending to the electron supply layer on the insulating layer and the passivation film; selectively oxidizing the electron supply layer in a lower portion of the gate opening part to form an oxide film; forming a gate insulating film to cover the lower portion and a side portion of the gate opening part; forming a gate electrode on the gate insulating film within the gate opening part; forming a drain electrode on the electron supply layer; and forming a source electrode on the electron supply layer in an opposite side of the drain electrode with respect to the gate electrode, wherein a film thickness of the passivation film is 10 nm or greater.

According to the present method, it is possible to obtain a nitride semiconductor device capable of appropriately lowering a concentration of a 2D electron gas generated within the electron transit layer.

In some embodiments, the method includes, before forming the insulating layer, forming a plate film on the passivation film, wherein forming the gate opening part includes etching the insulating layer and the plate film from an etching region including a region facing at least a portion of the plate film to form a first opening part and selectively removing the passivation film in a lower portion of the first opening part to form a second opening part communicating with the first opening part, and wherein forming the drain electrode includes forming a drain electrode on the electron supply layer so as to have the plate film interposed between the gate electrode and the drain electrode.

BRIEF DESCRIPTION OF THE DRAWINGS

FIG. 2G is a cross-sectional view illustrating a next process of FIG. 2F.

FIG. 2H is a cross-sectional view illustrating a next process of FIG. 2G.

FIG. 3 is an energy band diagram illustrating an energy distribution in a region other than a region directly below a gate electrode.

DETAILED DESCRIPTION

Embodiments of the present disclosure will now be described in detail with reference to the drawings.

Figure 1:
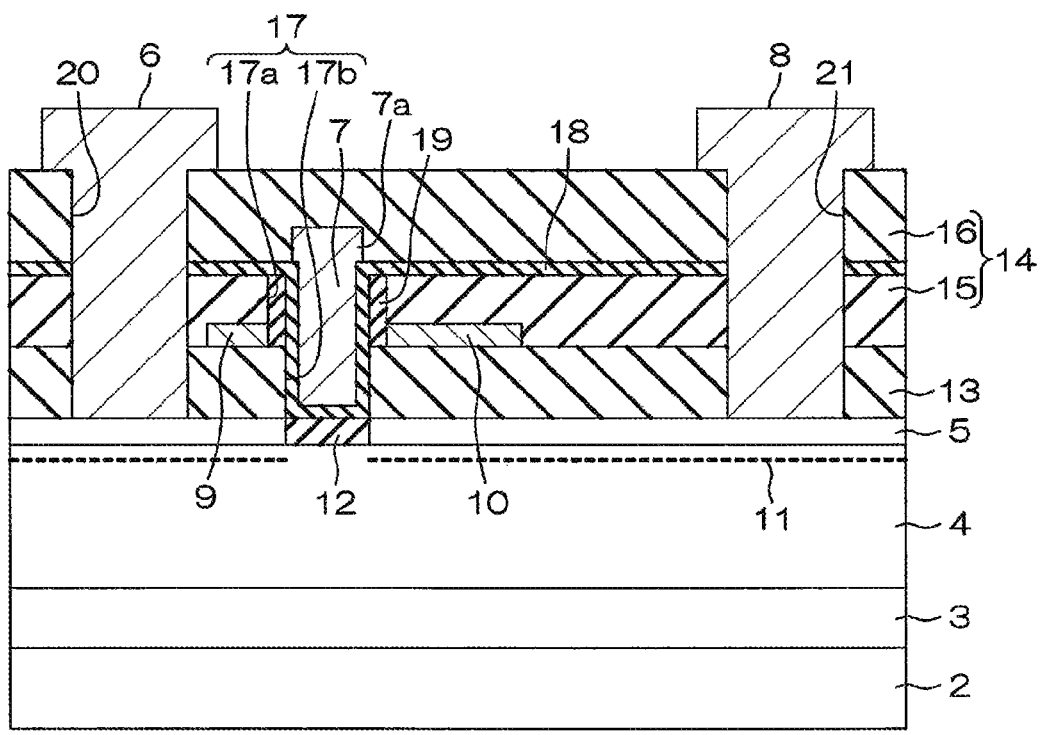
FIG. 1 is a cross-sectional view illustrating the configuration of a nitride semiconductor device according to an embodiment of the present disclosure.

FIG. 1 is a cross-sectional view illustrating the configuration of a nitride semiconductor device according to an embodiment of the present disclosure.

A nitride semiconductor device 1 includes a substrate 2, a buffer layer 3 formed on the surface of the substrate 2, an electron transit layer 4 epitaxially grown on the buffer layer 3, and an electron supply layer 5 epitaxially grown on the electron transit layer 4. The nitride semiconductor device 1 further includes a source electrode 6, a gate electrode 7, a drain electrode 8, a floating plate 9, and a source field plate 10, which are disposed on the electron supply layer 5. The floating plate 9 is disposed between the source electrode 6 and the gate electrode 7. The source field plate 10 is disposed between the gate electrode 7 and the drain electrode 8.

The substrate 2 may be, for example, a silicon substrate. The buffer layer 3 is formed of, for example, a single film of AlN. The buffer layer 3 may include a first buffer layer formed of an AlN film in contact with the surface of the substrate 2 and a second buffer layer formed of an AlGaN film stacked on a surface (surface opposing the substrate 2) of the first buffer layer.

The electron transit layer 4 and the electron supply layer 5 are formed of nitride semiconductors having different Al compositions. In this embodiment, the electron transit layer 4 is formed as a GaN layer and has a thickness of about 0.1 μm to 3.0 μm. The electron supply layer 5 is formed of a nitride semiconductor having an Al composition higher than that of the electron transit layer 4. In this embodiment, the electron supply layer 5 is formed as an AlN layer and has a thickness of about 1.5 nm to 7 nm. Preferably, the film thickness of the electron supply layer 5 is 1.5 nm or greater. The electron supply layer 5 is not limited to the AlN layer and may be formed as an $Al_xIn_yGa_{1-x-y}N$ layer (where $0.8 \leq x \leq 1.0$ and $0 \leq x+y \leq 1$).

In this manner, the electron transit layer 4 and the electron supply layer 5 are formed of nitride semiconductors having different Al compositions and a lattice mismatch occurs therebetween. Specifically, a lattice constant of AlN forming the electron supply layer 5 is smaller than that of GaN forming the electron transit layer 4. Therefore, tensile strain is applied to the electron supply layer 5 in a direction parallel to a growth surface. Further, due to the spontaneous polarization of the electron transit layer 4 and the electron supply layer 5 and the piezoelectric polarization caused by the lattice mismatch therebetween, an energy level of a conduction band of the electron transit layer 4 in an interface between the electron transit layer 4 and the electron supply layer 5 becomes lower than a Fermi level. Thus, a 2D electron gas (2DEG) 11 is spread in a position (for example, a distance of about a few Å from the interface) close to the interface between the electron transit layer 4 and the electron supply layer 5.

An oxide film 12 is selectively formed on the electron supply layer 5 to extend from a surface thereof to reach the electron transit layer 4. The oxide film 12 has almost the same film thickness as that of the electron supply layer 5.

The oxide film 12 is, for example, a thermal oxide film. When the electron supply layer 5 is an AlN layer, the oxide film 12 may be formed as an AlON film.

The nitride semiconductor device 1 further includes a passivation film 13 and an insulating layer 14 formed on the electron supply layer 5. The passivation film 13 is formed as an SiN film. In this embodiment, the passivation film 13 has a function of weakening polarization of the electron supply layer 5, as well as a function as an oxidation protective film of the electron supply layer 5. When the passivation film 13 only functions as an oxidation protective film of the electron supply layer 5, the film thickness of the passivation film 13 may sufficiently range from 2 nm to 3 nm. However, as in this embodiment, in order for the passivation film 13 to have the function of weakening the polarization of the electron supply layer 5, the film thickness of the passivation film 13 is preferably 10 nm or greater. In this embodiment, the film thickness of the passivation film 13 ranges from about 10 nm to 100 nm.

The insulating layer 14 covers the passivation film 13, and includes a first layer 15 and a second layer 16 on the first layer 15. For example, both of the first layer 15 and the second layer 16 may be formed as $SiO_2$ films. Further, the insulating layer 14 may have a thickness of 1.5 μm to 2 μm. Individually, the first layer 15 may have a thickness of 500 nm to 1000 nm, and the second layer 16 may have a thickness of 500 nm to 1000 nm.

A gate opening part 17 extending to the electron supply layer 5 (oxide film 12) is formed in the first layer 15 and the passivation film 13. The gate opening part 17 includes a first opening part 17a formed in the first layer 15, and a second opening part 17b formed in the passivation film 13 and communicating with the first opening part 17a. The oxide film 12 is exposed to a lower portion of the gate opening part 17. A gate insulating film 18 is formed to cover the lower portion and a side portion of the gate opening part 17. The gate insulating film 18 is also formed between the first layer 15 and the second layer 16 as well as within the gate opening part 17. For example, the gate insulating film 18 may be formed as at least one material film selected from the group consisting of Si, Al, and Hf as constituent elements. Specifically, the gate insulating film 18 may be formed as at least one material film selected from the group consisting of SiN, $SiO_2$, SiON, $Al_2O_3$, AlN, AlON, HfSiO, $HfO_2$, and the like. Among them, preferably, the gate insulating film 18 may be formed as an $Al_2O_3$ film. Further, the gate insulating film 18 may have a thickness of 10 nm to 100 nm.

A gate electrode 7 is embedded within the gate opening part 17. In this embodiment, the gate electrode 7 includes an overlapping portion 7a formed on the gate insulating film 18 at a circumference of the gate opening part 17. For example, the gate electrode 7 may be formed as a metal electrode such as Mo, Ni, etc., or may be formed as a semiconductor electrode such as doped polysilicon, etc. A gate length (width of the gate electrode 7) is 1 nm or smaller.

The floating plate 9 and the source field plate 10 are disposed on the side of the gate electrode 7 to partially form the side portion of the gate opening part 17. Specifically, the floating plate 9 and the source field plate 10 are formed on the passivation film 13 such that they are exposed to a lower side of the side portion of the gate opening part 17. That is to say, the lower side of the side portion of the gate opening part 17 is formed of the floating plate 9 and the source field plate 10 while an upper side thereof is formed of the insulating layer 14 (first layer 15), thus having a stacked interface of a conductive layer/insulating layer. The source field plate 10 is electrically connected to the source electrode 6. As is well known, the source field plate 10 is installed to alleviate a concentration of an electric field on an end portion of the gate electrode 7.

An insulating sidewall 19 is formed on a side portion of the first opening part 17a so as to be in contact with the floating plate 9 and the source field plate 10. That is to say, the sidewall 19 is disposed between the side portion of the first opening part 17a and the gate insulating film 18. For example, the sidewall 19 may be formed as at least one material film selected from the group consisting of $SiO_2$, SiN, and SiON. Among them, preferably, the sidewall 19 may be formed as a $SiO_2$ film. Further, the sidewall 19 may have a thickness of 10 nm to 200 nm.

The floating plate 9 and the source field plate 10 are insulated from the gate electrode 7 by the sidewall 19 and the gate insulating film 18. The floating plate 9 and the source field plate 10 may be formed as Mo films and have a thickness of 10 nm to 200 nm.

A source contact hole 20 and a drain contact hole 21 extending to the electron supply layer 5 are formed in the insulating layer 14 and the passivation film 13. The source contact hole 20 and the drain contact hole 21 are formed at positions away from the gate opening part 17 in a traverse direction. The source electrode 6 and the drain electrode 8 are embedded in the source contact hole 20 and the drain contact hole 21, respectively. The source electrode 6 and the drain electrode 8 are electrically connected to the electron supply layer 5 within the source contact hole 20 and the drain contact hole 21, respectively.

In the nitride semiconductor device 1, the electron supply layer 5 having a different Al composition is formed on the electron transit layer 4 to form a hetero-junction. Thus, the 2D electron gas 11 is formed within the electron transit layer 4 near the interface between the electron transit layer 4 and the electron supply layer 5 and an HEMT using the 2D electron gas 11 as a channel is formed. The gate electrode 7 faces the electron transit layer 4 with a stacked film of the oxide film 12 and the gate insulating film 18 interposed therebetween, and the electron supply layer 5 is not present directly below the gate electrode 7. Therefore, the 2D electron gas 11 resulting from the polarization due to the lattice mismatch between the electron supply layer 5 and the electron transit layer 4 is not formed directly below the gate electrode 7. Thus, when a bias is not applied to the gate electrode 7 (at the time of zero biasing), a channel by the 2D electron gas 11 is blocked directly below the gate electrode 7. In this manner, a normally OFF type HEMT is realized. When an appropriate ON voltage (e.g., 5V) is applied to the gate electrode 7, a channel is induced directly below the gate electrode 7 within the electron transit layer 4 and the 2D electron gas 11 on both sides of the gate electrode 7 are connected. Accordingly, the source and the drain are conducted.

When used, for example, a predetermined voltage (e.g., 200V to 400V) making the drain electrode 8 positive is applied between the source electrode 6 and the drain electrode 8. In this state, an OFF voltage (0V) or an ON voltage (5V) is applied to the gate electrode 7, using the source electrode 6 as a reference potential (0V).

An interface between the oxide film 12 and the electron transit layer 4 continues to an interface between the electron supply layer 5 and the electron transit layer 4, and a state of the interface of the electron transit layer 4 directly below the gate electrode 7 is the same as that of the interface between the electron supply layer 5 and the electron transit layer 4. Therefore, the electron mobility at the electron transit layer 4 directly below the gate electrode 7 is maintained to be high. Thus, in this embodiment, a nitride semiconductor device having the normally OFF type HEMT structure is provided.

FIGS. 2A to 2M are cross-sectional views illustrating an example of a manufacturing process of the aforementioned nitride semiconductor device 1, in which the cross-sectional structures in a plurality of steps of the manufacturing process are shown.

Figure 2A:
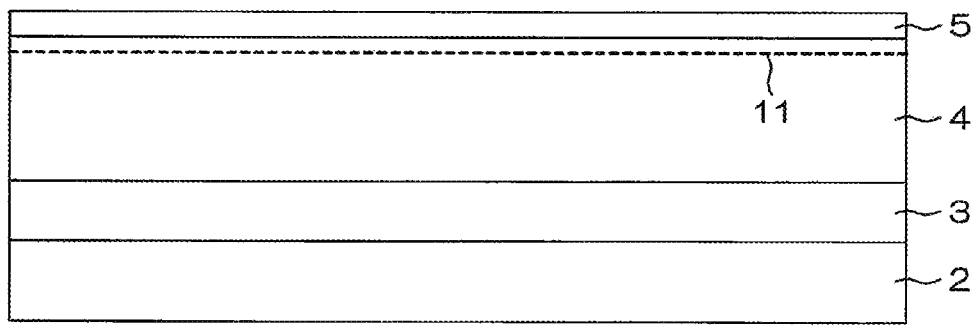
FIG. 2A is a cross-sectional view illustrating an example of a process of manufacturing the nitride semiconductor device.

First, as illustrated in FIG. 2A, a buffer layer 3 and an electron transit layer 4 are epitaxially grown on a substrate 2 in sequence. And then, the electron supply layer 5 is epitaxially grown on the electron transit layer 4.

Figure 2B:
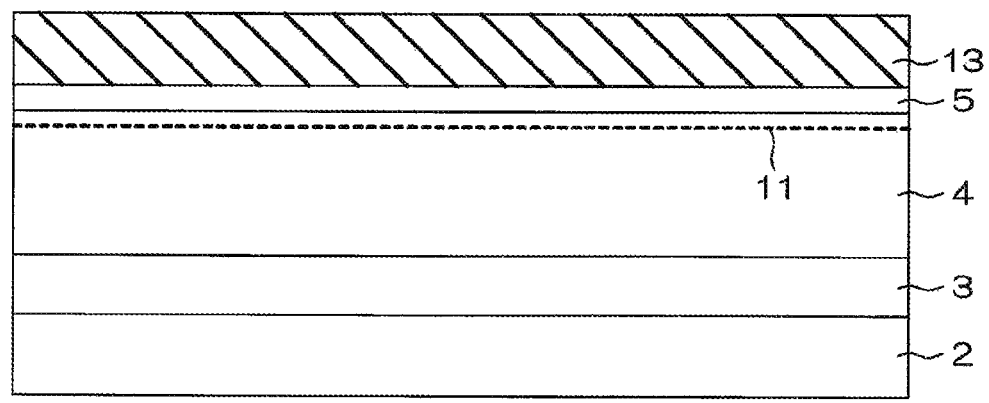
FIG. 2B is a cross-sectional view illustrating a next process of FIG. 2A.

Next, as illustrated in FIG. 2B, a passivation film 13 is formed to cover the entire surface of the electron supply layer 5 through, for example, a thermal CVD method (thermochemical vapor deposition method). In this embodiment, the passivation film 13 is formed within a film forming apparatus in which the buffer layer 3, the electron transit layer 4, and the electron supply layer 5 are formed.

Figure 2C:
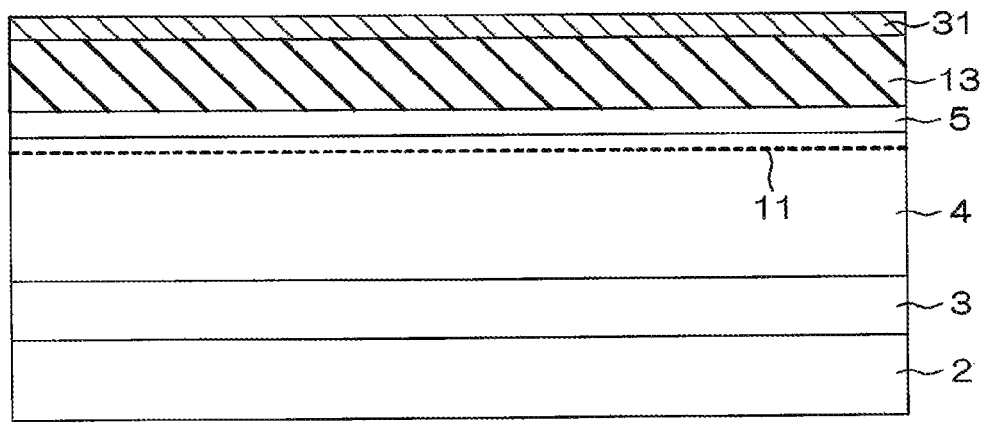
FIG. 2C is a cross-sectional view illustrating a next process of FIG. 2B.
Figure 2D:
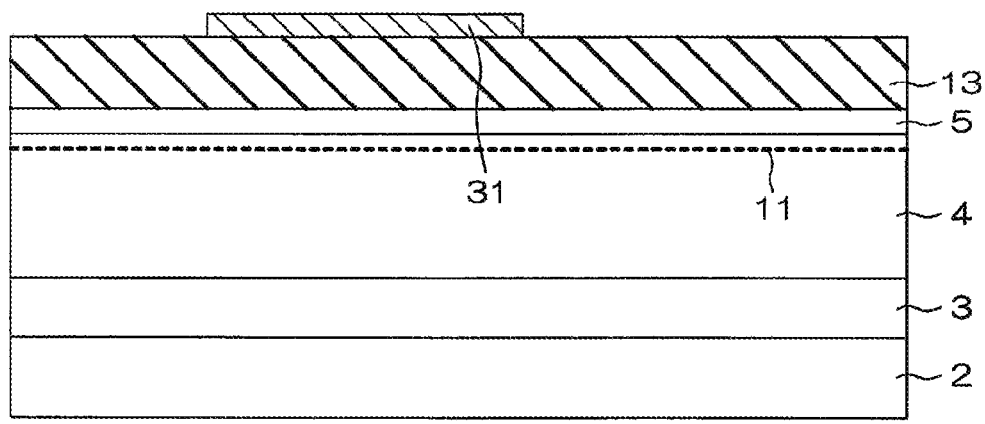
FIG. 2D is a cross-sectional view illustrating a next process of FIG. 2C.

Thereafter, as illustrated in FIG. 2C, a plate film 31 is formed on the passivation film 13 through a sputtering method, a deposition method, or the like. And then, as illustrated in FIG. 2D, the plate film 31 is selectively removed through, for example, dry etching. Thus, the plate film 31 is formed between a formation region of the source electrode 6 and a formation region of the drain electrode 8.

Figure 2E:
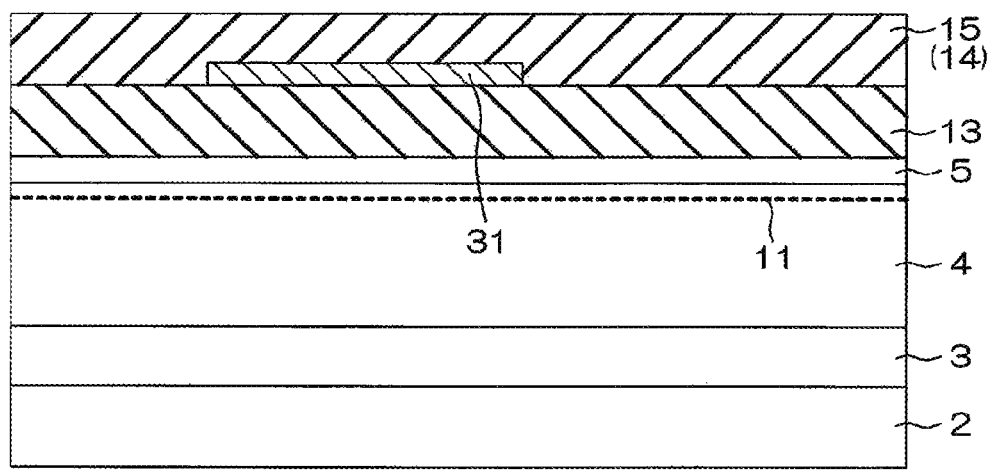
FIG. 2E is a cross-sectional view illustrating a next process of FIG. 2D.

Subsequently, as illustrated in FIG. 2E, a first layer 15 of an insulating layer 14 is formed to cover the entire surface of the electron supply layer 5 through, for example, a CVD method (chemical vapor deposition method). Thus, the plate film 31 is embedded within the first layer 15.

Figure 2F:
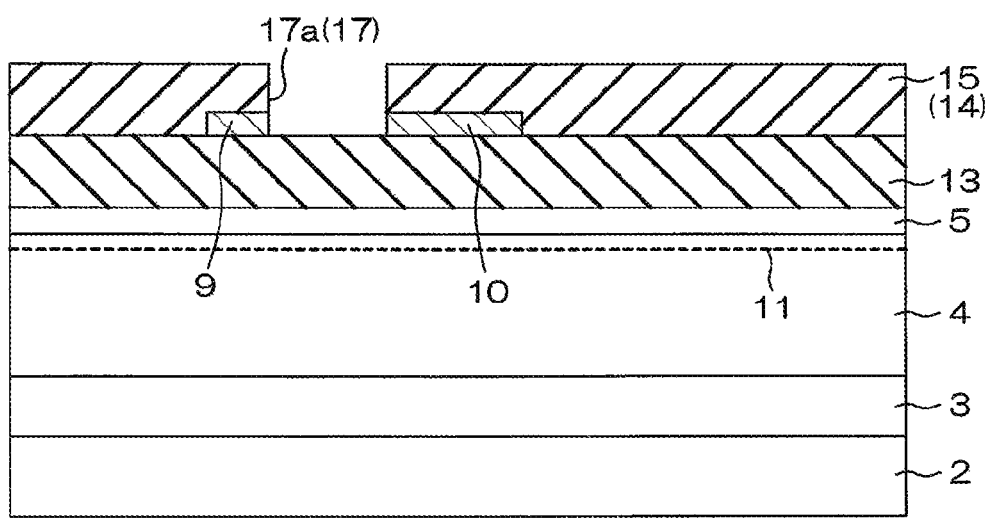
FIG. 2F is a cross-sectional view illustrating a next process of FIG. 2E.

Next, as illustrated in FIG. 2F, the first layer 15 and the plate film 31 are etched from an etching region including a region facing the plate film 31 to form a first opening part 17a (gate opening part 17). Accordingly, the plate film 31 is separated into the floating plate 9 on a source side with respect to the first opening part 17a and the source field plate 10 on a drain side with respect to the first opening part 17a. Thus, the floating plate 9 and the source field plate 10 are exposed to the side portion of the first opening part 17a (gate opening part 17) in this stage.

Thereafter, as illustrated in FIG. 2G, an insulating film 32 for forming a sidewall 19 is formed to cover the entire surface of the electron supply layer 5 through, for example, a CVD method (chemical vapor deposition method). A process of forming the insulating film 32 includes a process of forming a lower layer film 33 in contact with the first layer 15 (insulating layer 14) and a process of forming an upper layer film 34 forming the uppermost surface of the insulating film 32. For example, the lower layer film 33 may be formed as a $SiO_2$ film and the upper layer film 34 may be formed as an $Al_2O_3$ film. When both of the first layer 15 (insulating layer 14) and the lower layer film 33 are $SiO_2$ films, the adhesion of the lower layer film 33 with respect to the first layer 15 can be increased. Thus, it is possible to prevent a detachment of the sidewall 19 in a subsequent process.

Thereafter, as illustrated in FIG. 2H, a portion of the insulating film 32 on the first layer 15 is selectively removed through e.g., etchback, and the insulating film 32 remains on a side portion of the first opening part 17a. If an $Al_2O_3$ film is employed as the upper layer film 34, a portion of the $Al_2O_3$ film that is hard to etch may remain as a protrusion 35 upward from the first opening part 17a after etchback.

Figure 2I:
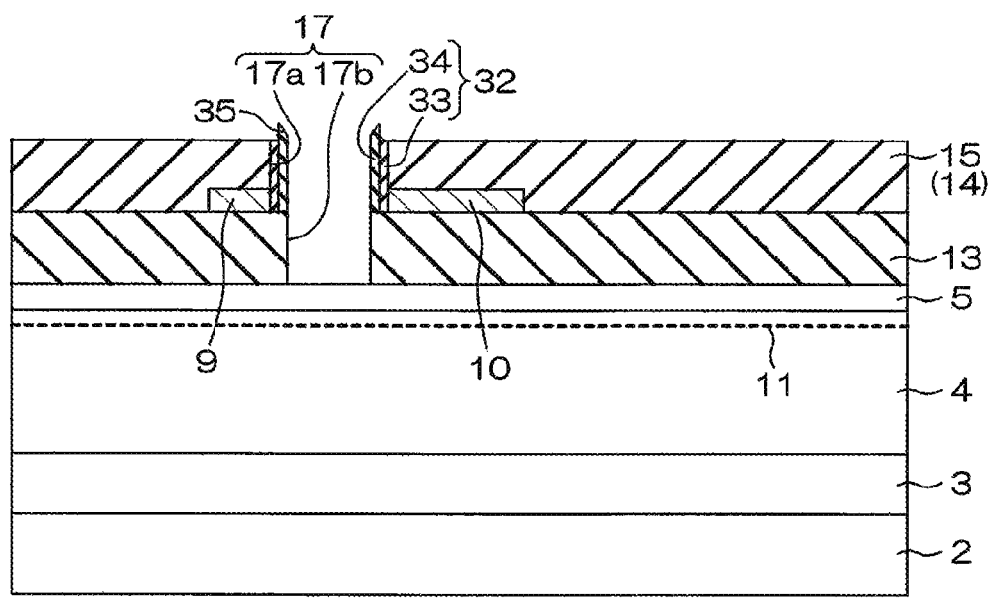
FIG. 2I is a cross-sectional view illustrating a next process of FIG. 2H.

Thereafter, as illustrated in FIG. 2I, the passivation film 13 in a lower portion of the first opening part 17a is selectively removed through, for example, dry etching. Accordingly, a second opening part 17b communicating with the first opening part 17a is formed in the passivation film 13. That is to say, the gate opening part 17 including the first opening part 17a and the second opening part 17b is formed. Thus, the electron supply layer 5 is exposed to the lower portion of the gate opening part 17. When the passivation film 13 is an SiN film and the upper layer film 34 is an $Al_2O_3$ film, an etch selectivity ratio of the upper layer film 34 can be reduced with respect to an etchant (for example, a $CF_4$ gas or the like) of the passivation film 13. Therefore, when the passivation film 13 is etched, since the lower layer film 33 can be protected by the upper layer film 34, it is possible to suppress the lower layer film 33 (sidewall 19) from being etched together with the passivation film 13 and thinned. Thus, the sidewall 19 having a thickness close to a designed value can be maintained even after the passivation film 13 is etched.

Figure 2J:
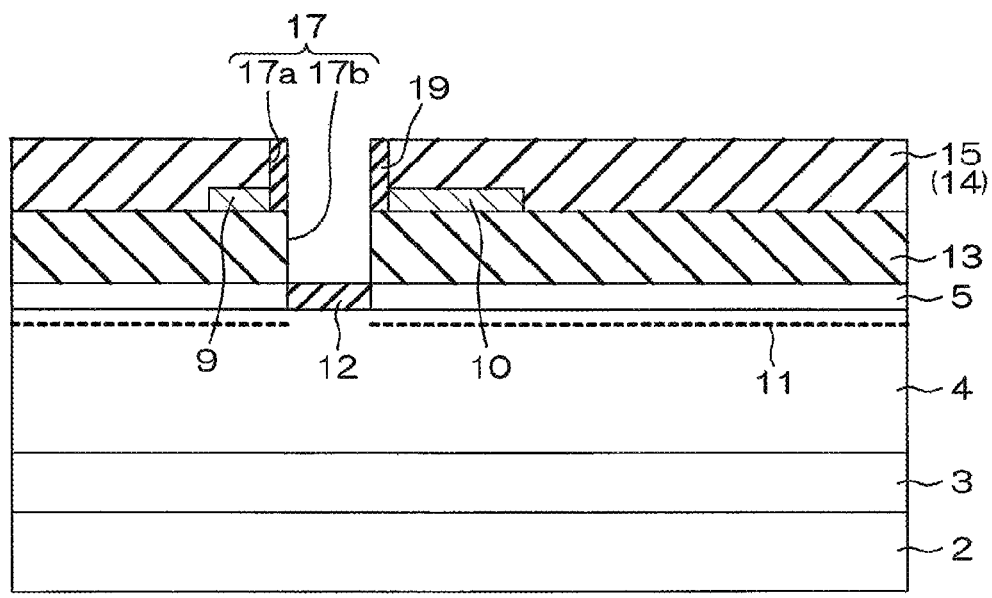
FIG. 2J is a cross-sectional view illustrating a next process of FIG. 2I.

Thereafter, as illustrated in FIG. 2J, a surface portion of the sidewall 19 is selectively removed through, for example, dry etching. In this embodiment, since the upper layer film 34 forming the outermost surface is selectively removed, the lower layer film 33 remains as the sidewall 19. When the upper layer film 34 is an $Al_2O_3$ film, for example, a $BCl_3$ gas may be used as an etchant. Thereafter, as a portion exposed to the gate opening part 17 of the electron supply layer 5 is selectively oxidized, a portion of the electron supply layer 5 becomes an oxide film 12.

Figure 2K:
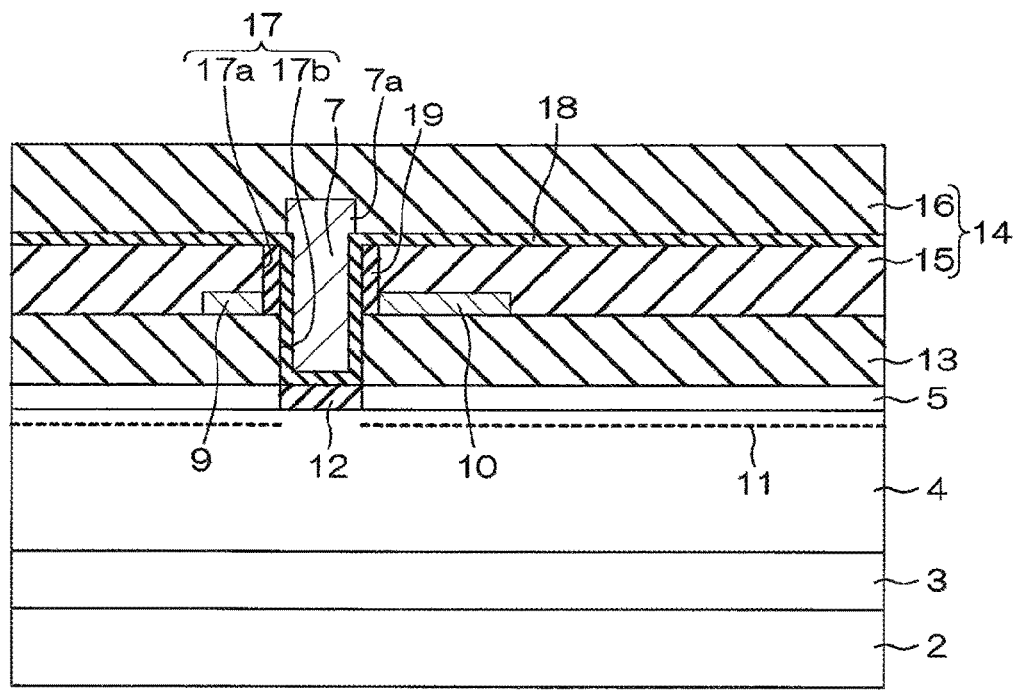
FIG. 2K is a cross-sectional view illustrating a next process of FIG. 2J.

Thereafter, as illustrated in FIG. 2K, a gate insulating film 18 is formed to cover the entire surface of the electron supply layer 5 through, for example, a CVD method (chemical vapor deposition method), and also, a gate electrode 7 is embedded within the gate insulating film 18. As mentioned above, in this embodiment, the gate electrode 7 includes an overlapping portion 7a formed on the gate insulating film 18 at the circumference of the gate opening part 17. After forming the gate electrode 7, a second layer 16 of the insulating layer 14 is formed to cover the entire surface of the electron supply layer 5 through, for example, a CVD method (chemical vapor deposition method).

Figure 2L:
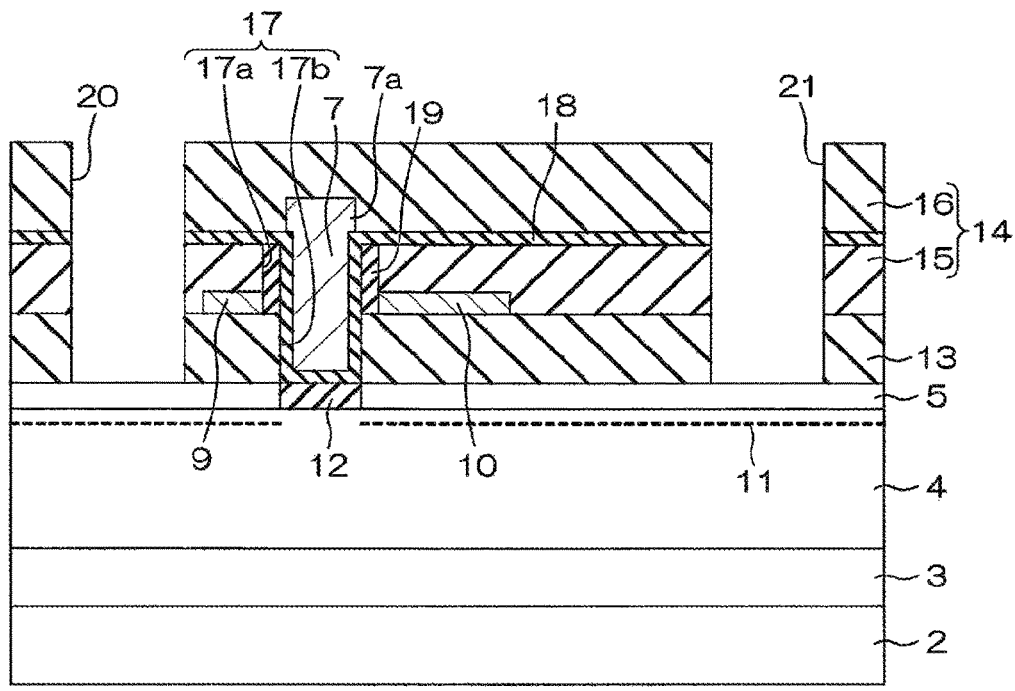
FIG. 2L is a cross-sectional view illustrating a next process of FIG. 2K.

Thereafter, as illustrated in FIG. 2L, the second layer 16, the gate insulating film 18, and the first layer 15 are selectively removed in a formation region of the source electrode 6 and a formation region of the drain electrode 8 through, for example, dry etching. Thus, a source contact hole 20 and a drain contact hole 21 are simultaneously formed.

Figure 2M:
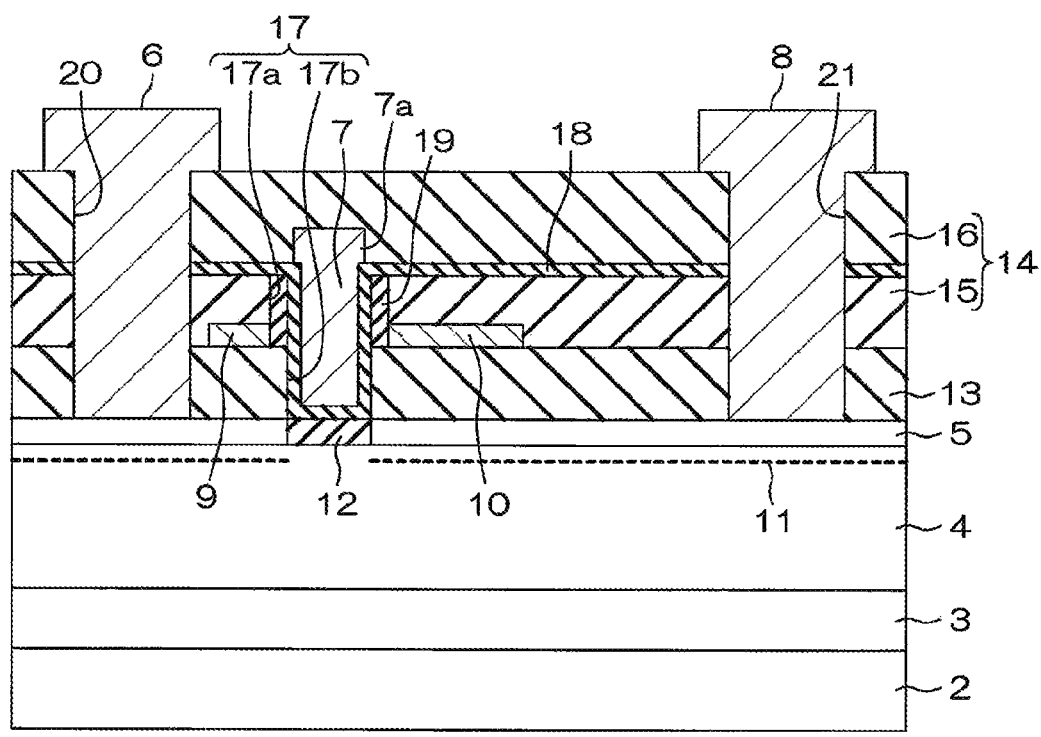
FIG. 2M is a cross-sectional view illustrating a next process of FIG. 2L.

Thereafter, as illustrated in FIG. 2M, an electrode film is formed on the insulating layer 14 to cover the entire surface of the electron supply layer 5 through, for example, a sputtering method, a deposition method, etc., and the electrode film is patterned to form the source electrode 6 and the drain electrode 8. Through the aforementioned processes, the nitride semiconductor device 1 illustrated in FIG. 1 can be obtained.

In the nitride semiconductor device 1, the electron transit layer 4 is formed as a GaN layer, and the electron supply layer 5 is formed as an AlN layer. A lattice constant of AlN forming the electron supply layer 5 is smaller than that of GaN forming the electron transit layer 4. Thus, the tensile strain is applied by the electron transit layer 4 to the electron supply layer 5 in a direction parallel to a growth surface. As the tensile strain applied to the electron supply layer 5 is increased, the piezoelectric polarization generated in the electron supply layer 5 is increased and a concentration of a 2D electron gas generated within the electron transit layer 4 is increased.

In this embodiment, since the AlN layer is used as the electron supply layer 5, the tensile strain applied to the electron supply layer 5 is increased, for example, compared with a case where an $Al_{0.25}Ga_{0.75}N$ layer is used as the electron supply layer 5. Therefore, there is a possibility that the concentration of the 2D electron gas generated within the electron transit layer 4 will be excessively high. If the concentration of the 2D electron gas generated within the electron transit layer 4 is excessively high, the withstanding voltage of the nitride semiconductor device 1 is degraded.

Thus, in this embodiment, in order to reduce the piezoelectric polarization generated in the electron supply layer 5, the passivation film 13 formed as an SiN film and having a film thickness of 10 nm or greater is formed on the electron supply layer 5. The electron supply layer 5 formed of AlN is grown according to a lattice constant of GaN forming the electron transit layer 4. A coefficient of thermal expansion of GaN forming the electron transit layer 5 and a coefficient of thermal expansion of SiN forming the passivation film 13 are almost the same, while a film-forming temperature of SiN is higher than that of GaN. Specifically, a film-forming temperature of GaN is at about 1000 degrees C., while a film formation temperature of SiN is at about 1150 degrees C. Therefore, after forming the passivation film 13, when the passivation film 13 returns to room temperature, the SiN forming the passivation film 13 shrinks, compared with the GaN forming the electron transit layer 4. Thus, the passivation film 13 applies compressive stress to the electron supply layer 5 and the electron transit layer 4. As a result, since the piezoelectric polarization generated in the electron supply layer 5 is reduced, it is possible to appropriately lower the concentration of the 2D electron gas generated within the electron transit layer 4.

FIG. 3 is an energy band diagram illustrating an energy distribution in a region other than a region directly below a gate electrode. In FIG. 3, GaN represents the electron transit layer 4, and AlGaN (including AlN as well as AlGaN) represents the electron supply layer 5. In FIG. 3, E represents an internal electric field of AlGaN.

In the region other than the region directly below the gate electrode 7, as illustrated in FIG. 3, an energy level $E_C$ of a conduction band of the electron transit layer 4 in an interface between the electron transit layer 4 and the electron supply layer 5 is lower than a Fermi level $E_F$, and a 2D electron gas is generated within the electron transit layer 4.

In this case, a surface donor level $E_{DD}$ is expressed by the following Eq. (1), and thus, a sheet carrier density (2D electron gas density) $N_S$ is expressed by the following Eq. (2):

$$E_{DD} = \frac{d}{\varepsilon_o \varepsilon_{AlGaN}}[P - q\{N_S + (N_T - N_D)W\}] + \Delta E_C \quad \text{Eq. (1)}$$

$$W = \sqrt{\frac{2E_{DA}\varepsilon_o \varepsilon_{GaN}}{q(N_T - N_D)}}$$

$$N_S = \frac{P}{q} - \frac{\varepsilon_{AlGaN}\varepsilon_o}{qd}(E_{DD} - \Delta E_C) - (N_T - N_D)W \quad \text{Eq. (2)}$$

In Eq. (1), the signals are defined as follows:
q: basic quantity of electric charge
$N_S$: sheet carrier density (2D electron gas density),
$E_{DD}$: surface donor level
$\Delta E_C$: energy difference between conduction bands of AlN and GaN
d: film thickness of AlGaN
$\varepsilon_0$: vacuum permittivity
$\varepsilon_{AlGaN}$: dielectric constant of AlGaN $\varepsilon_{GaN}$: dielectric constant of GaN
$N_T$: deep acceptor density of GaN
$E_{DA}$: deep acceptor level of GaN
$N_D$: donor density of GaN
W: width in which depth acceptor of GaN emits holes by polarization of AlGaN
P: difference in polarization between AlGaN and GaN (total polarization in interface of AlGaN/GaN)

$$P = P_{sp(AlGaN)} + P_{pz(AlGaN)} - P_{sp(GaN)}$$

$P_{sp(AlGaN)}$: spontaneous polarization of AlGaN
$P_{pz(AlGaN)}$: piezoelectric polarization of AlGaN
$P_{sp(GaN)}$: spontaneous polarization of GaN From Eq. (2), it can be appreciated that a sheet carrier density $N_S$ is increased as a difference P of polarization between the electron transit layer 4 and the electron supply layer 5 is increased and as a film thickness d of the electron supply layer 5 is larger.

With respect to the nitride semiconductor device 1 of FIG. 1, a nitride semiconductor device having a configuration in which $Al_{0.25}Ga_{0.75}N$ is used as the electron supply layer 5 and a film thickness of the passivation film 13 is 3 nm will be used as a reference example. Further, with respect to the nitride semiconductor device 1 of FIG. 1, a nitride semiconductor device having a configuration in which a film thickness of the passivation film 13 is 3 nm will be used as a comparative example.

Figure 4:
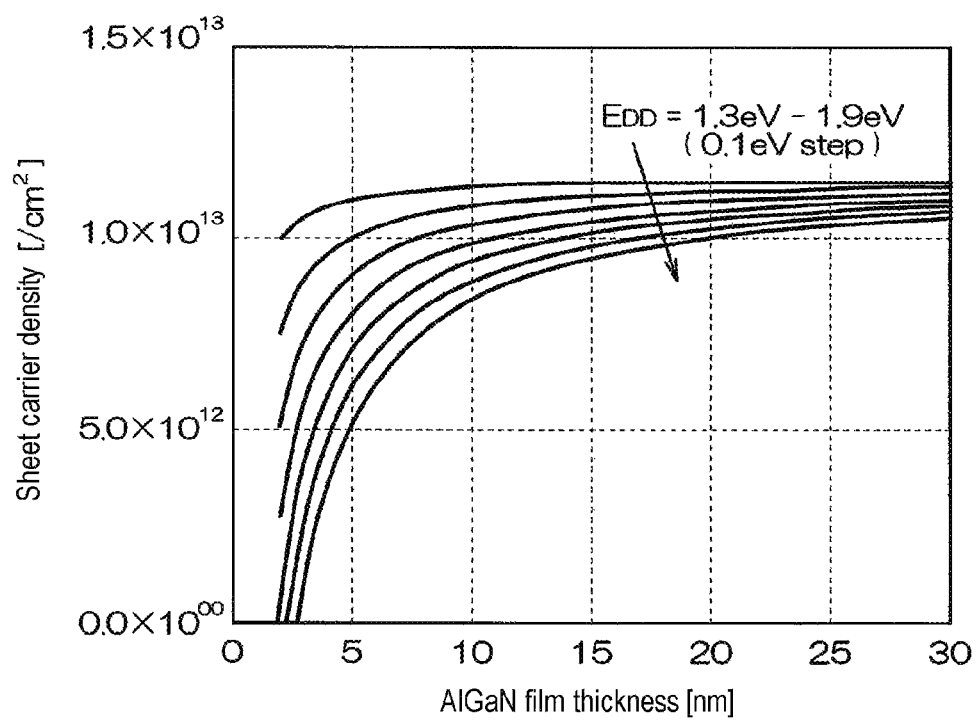
FIG. 4 is a graph illustrating the characteristics of a sheet carrier density Ns with respect to a film thickness of an electron supply layer in a region other than a region directly below a gate electrode of a reference example, based on a surface donor level $E_{DD}$ as a parameter.

FIG. 4 is a graph illustrating the characteristics of a sheet carrier density Ns with respect to a film thickness of an electron supply layer in a region other than a region directly below a gate electrode of a reference example, based on a surface donor level $E_{DD}$ as a parameter. The surface donor level $E_{DD}$ is changed from 1.3 eV to 1.9 eV by 0.1 eV each time. A difference P of polarization between AlGaN and GaN was set to $2.06 \times 10^{-6}$ [C/cm$^2$].

In this embodiment, an ideal value of the sheet carrier density $N_S$ is considered to be, for example, $1.0 \times 10^3$ [/cm$^2$] in designing a device. When the sheet carrier density $N_S$ exceeds the ideal value, the withstanding voltage is degraded. In the reference example, a film thickness of the electron supply layer whose a value of the sheet carrier density $N_S$ is close to $1.0 \times 10^3$ [/cm$^2$], ranges from 15 nm to 25 nm. Further, within this range, a change in the sheet carrier density with respect to a change in a film thickness of the electron supply layer is small. Therefore, in the reference example in which $Al_{0.25}Ga_{0.75}N$ is used as the electron supply layer 5, an allowable error range of the film thickness of the electron supply layer is large.

Figure 5:
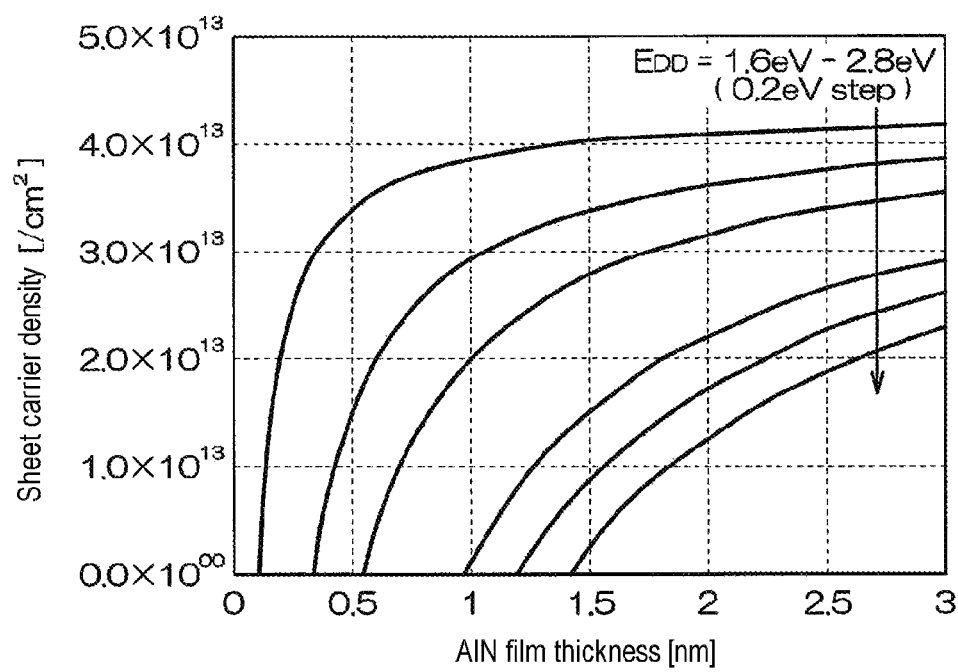
FIG. 5 is a graph illustrating the characteristics of a sheet carrier density Ns with respect to a film thickness of an electron supply layer in a region other than a region directly below a gate electrode of a comparative example, based on a surface donor level $E_{DD}$ as a parameter.

FIG. 5 is a graph illustrating the characteristics of a sheet carrier density $N_S$ with respect to a film thickness of an electron supply layer in a region other than a region directly below a gate electrode of a comparative example, based on a surface donor level $E_{DD}$ as a parameter. The surface donor level $E_{DD}$ is changed from 1.6 eV to 2.8 eV by 0.2 eV each time. A difference P of polarization between AlN and GaN was set to $P = 7.53 \times 10^{-6}$ [C/cm$^2$]. Further, $N_T - N_D = 1.0 \times 10^{16}$ [/cm$^3$]. Also, in the comparative example, since a film thickness of the passivation film 13 is thin, the compressive stress applied by the passivation film 13 to the electron supply layer 5 was set to 0.

In the comparative example, since AlN is used as the electron supply layer 5, the sheet carrier density $N_S$ with respect to the film thickness of the electron supply layer 5 is high, compared with the reference example. Further, in the comparative example, a rate of change of the sheet carrier density $N_S$ with respect to the film thickness of the electron supply layer 5 is also high, compared with the reference example. In the comparative example, a film thickness of the electron supply layer whose a value of the sheet carrier density $N_S$ is close to $1.0 \times 10^3 [/cm^2]$ is, for example, about 1.25 nm in case of $E_{DD}$=2.4 [eV]. Therefore, in the comparative example, the film thickness of the electron supply layer 5 should be controlled to be around 1.25 nm.

Figure 6:
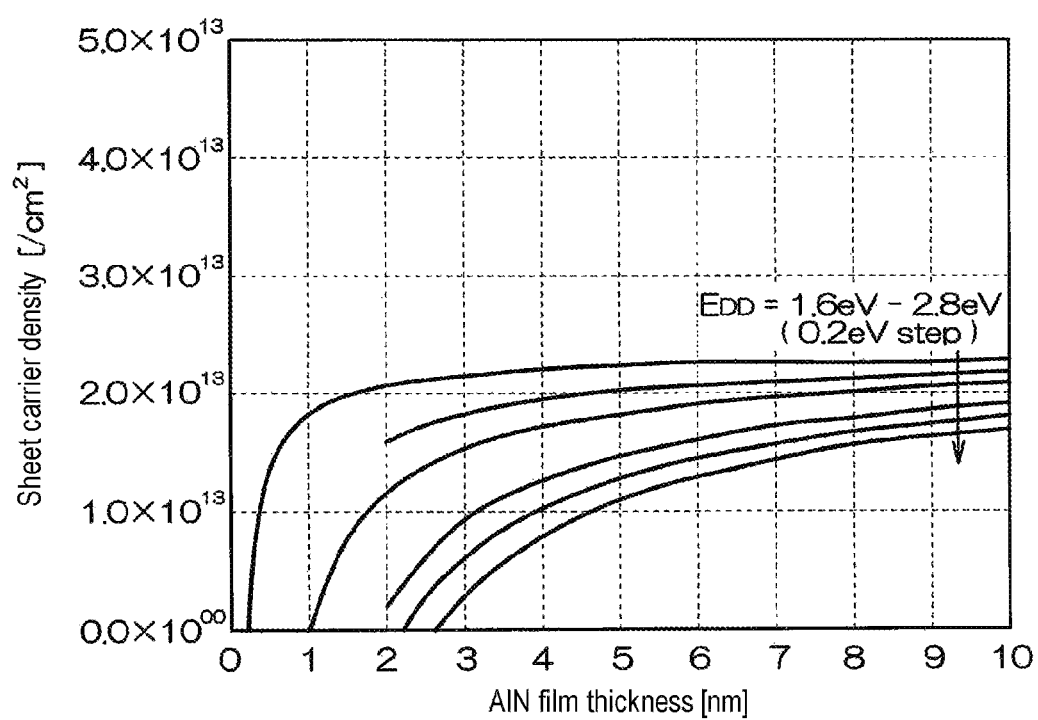
FIG. 6 is a graph illustrating the characteristics of a sheet carrier density Ns with respect to a film thickness of an electron supply layer in a region other than a region directly below a gate electrode of the present embodiment, based on a surface donor level $E_{DD}$ as a parameter.

FIG. 6 is a graph illustrating the characteristics of a sheet carrier density $N_S$ with respect to a film thickness of an electron supply layer in a region other than a region directly below a gate electrode of the present embodiment, based on a surface donor level $E_{DD}$ as a parameter. The surface donor level $E_{DD}$ is changed from 1.6 eV to 2.8 eV by 0.2 eV each time. A difference P of polarization between AlN and GaN was set to $P=7.53 \times 10^{-6} [C/cm^2]$. Also, $N_T - N_D = 1.0 \times 10^{16} [/cm^3]$.

In this embodiment, since the film thickness of the passivation film 13 is thick, compared with the comparative example, the compressive strain of a predetermined level or greater is applied by the passivation film 13 to the electron supply layer 5. Thus, the sheet carrier density $N_S$ with respect to the film thickness of the electron supply layer 5 is reduced, compared with the comparative example. In this embodiment, a range of the film thickness of the electron supply layer 5 whose a value of the sheet carrier density $N_S$ is close to $1.0 \times 10^3 [/cm^2]$ is, for example, about 3.2 nm in case of $E_{DD}$=2.4 [eV]. Thus, in this embodiment, since the film thickness of the electron supply layer 5 can be controlled to be around 3.2 nm, an allowable error range of the film thickness widens, compared with the comparative example.

Figure 7:
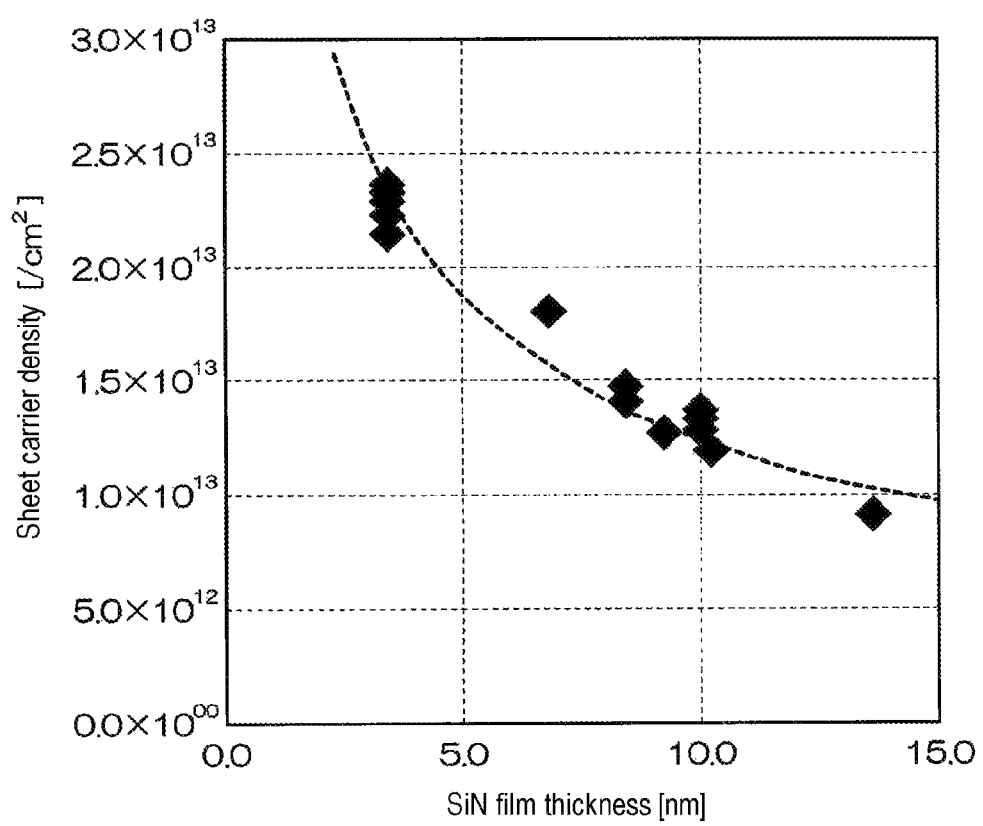
FIG. 7 is a graph illustrating the characteristics of a sheet carrier density Ns with respect to a film thickness of a passivation film of the present embodiment.

FIG. 7 is a graph illustrating the characteristics of a sheet carrier density $N_S$ with respect to a film thickness of a passivation film of the present embodiment.

In FIG. 7, it can be appreciated that the sheet carrier density $N_S$ is reduced as the film thickness of the passivation film 13 is increased. Further, it can be appreciated that, if an ideal value of the sheet carrier density $N_S$ is about $1.0 \times 10^3 [/cm^2]$, the film thickness of the passivation film 13 is preferably 10 nm or larger.

In the nitride semiconductor device 1, capacitances Cgs, Cgd, and Cds are present among the respective terminals of the source, the gate, and the drain. Cgs is capacitance between the gate electrode 7 and the source electrode 6; Cgd is capacitance between the gate electrode 7 and the drain electrode 8; and Cds is capacitance between the drain electrode 8 and the source electrode 6. The sum of Cds and Cgd is referred to as output capacity Coss.

That is to say, the output capacity Coss is expressed as Coss=Cds+Cgd. In a case where the source field plate 10 electrically connected to the source electrode 6 is installed as in the present embodiment and the comparative example, the capacity Cds between the drain and the source is increased.

Figure 8:
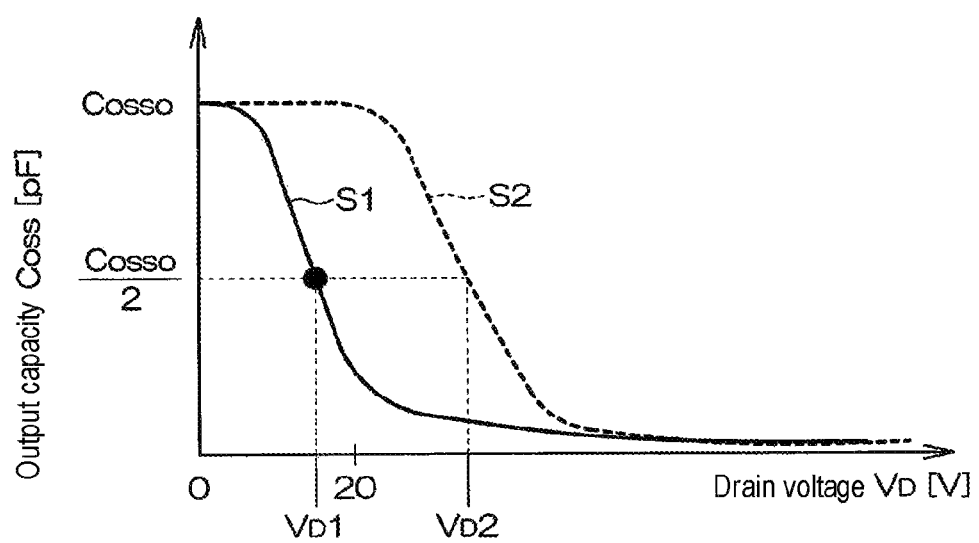
FIG. 8 is a graph illustrating the characteristics of an output capacity Coss with respect to a drain voltage $V_D$ of the present embodiment and the comparative example.

FIG. 8 is a graph illustrating the characteristics of an output capacity Coss with respect to a drain voltage $V_D$ of the present embodiment and the comparative example. The curved line S1 indicated by the solid line in FIG. 8 represents the characteristics of the present embodiment, and the curved line S2 indicated by the dotted line in FIG. 8 represents the characteristics of the comparative example.

When the source electrode 6 is grounded; a gate voltage (voltage between the gate and the source) is zero; and the drain voltage $V_D$ (voltage between the drain and the source) is increased, since a 2D electron gas directly below the source field plate 10 is reduced, the capacitance Cds between the drain and the source is reduced. Thus, the output capacity Coss is reduced. As a concentration of a 2D electron gas generated within the electron transit layer 4 of a semiconductor device is higher, the output capacity Coss is difficult to reduce. Thus, if an output capacity when the drain voltage $V_D$ is 0V is set as a reference output capacity Cosso, a drain voltage whose output capacity Coss is ½ of the reference output capacity Cosso has a greater value as a nitride semiconductor device has a greater concentration of a 2D electron gas.

As illustrated in FIG. 8, in this embodiment, a drain voltage $V_D 1$ whose output capacity Coss is ½ of the reference output capacity Cosso is 20V or lower. On the other hand, in the comparative example, a drain voltage $V_D 2$ whose output capacity Coss is ½ of the reference output capacity Cosso is higher than 20V.

In the aforementioned embodiment, in order to alleviate the concentration of an electric field on the gate electrode 7, the source field plate 10 is installed. However, instead of the source field plate 10, a gate field plate integrated with the gate electrode may also be installed. In this case, the capacitance Cgd between the gate and the drain is increased. When the drain voltage $V_D$ (voltage between the drain and the source) is increased, the 2D electron gas directly below the gate field plate is reduced, resulting in a reduction in the capacitance Cgd between the gate and the drain. Accordingly, the output capacitance Coss is reduced. Thus, the characteristics of the output capacity Coss with respect to the drain voltage $V_D$ in the case where the gate field plate is installed are the same as the characteristics in a case where a source field plate is installed.

In the aforementioned embodiment, silicon is applied as a material example of the substrate 2, but in addition, a certain substrate material such as a sapphire substrate or a GaN substrate may also be applied.

Further, various design modifications may be made within the scope of the present disclosure described in claims.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device, comprising:
   an electron transit layer formed of GaN;
   an electron supply layer formed on the electron transit layer and to which tensile strain is applied by the electron transit layer, the electron supply layer being formed as an $Al_x In_y Ga_{1-x-y} N$ layer where $0 \leq x+y \leq 1$;
   a passivation film connected to an upper surface of the electron supply layer and formed of SiN, the passivation film having an opening part extending to the electron supply layer;
   a gate electrode formed on the electron supply layer through a gate insulating film formed within the opening part; and
   a source electrode and a drain electrode disposed away from the gate electrode to have the gate electrode interposed therebetween, the source electrode and the drain electrode being electrically connected to the electron supply layer,
   wherein the tensile strain from the electron transit layer to the electron supply layer, compressive strain from the passivation film to the electron supply layer, and compressive strain from the passivation film to the electron transit layer lower a concentration of a 2D electron gas generated within the electron transit layer,
wherein the compressive strain from the passivation film is applied to the electron transit layer, and
wherein the electron supply layer comprises an oxide film formed to be exposed to a lower portion of the opening part, the oxide film being formed by oxidation of the electron supply layer.

2. The device of claim 1, further comprising a field plate configured to alleviate concentration of an electric field on the gate electrode,
wherein, if an output capacity Coss when a drain voltage is 0V is set as a reference output capacity Cosso, a drain voltage whose output capacity Coss is ½ of the reference output capacity Cosso is 20V or lower.

3. The device of claim 1, wherein a gate length is 1 μm or smaller.

4. The device of claim 1, wherein the electron supply layer is formed as an AlN layer.

5. The device of claim 1, wherein the electron transit layer is formed as a GaN layer.

6. The device of claim 1, wherein the passivation film is formed through a thermal CVD method.

7. The device of claim 1, wherein a film thickness of the electron supply layer is 1.5 nm or greater.

8. The device of claim 1, wherein the passivation film is formed within a film forming apparatus for forming the electron transit layer.

9. The device of claim 1, further comprising a source field plate disposed near the gate electrode on the passivation film, the source field plate being electrically connected to the source electrode.

10. The device of claim 2, wherein the field plate is a source field plate disposed near the gate electrode on the passivation film, the field plate being electrically connected to the source electrode.

11. The nitride semiconductor device of claim 1, wherein $0.8 \leq x \leq 1.0$.

12. The nitride semiconductor device of claim 1, wherein a film thickness of the passivation film is 10 nm or greater.

13. A method of manufacturing a nitride semiconductor device, comprising:
forming an electron transit layer formed of GaN;
forming an electron supply layer to which tensile strain is applied by the electron transit layer, the electron supply layer being formed as an $Al_xIn_yGa_{1-x-y}N$ layer where $0 \leq x+y \leq 1$ on the electron transit layer;
forming a passivation film connected to an upper surface of the electron supply layer and formed of SiN through a thermal CVD method;
forming an insulating layer on the passivation film;
forming a gate opening part extending to the electron supply layer on the insulating layer and the passivation film;
selectively oxidizing the electron supply layer to form an oxide film to be exposed to a lower portion of the gate opening part;
forming a gate insulating film to cover the lower portion and a side portion of the gate opening part;
forming a gate electrode on the gate insulating film within the gate opening part;
forming a drain electrode on the electron supply layer; and
forming a source electrode on the electron supply layer in an opposite side of the drain electrode with respect to the gate electrode,
wherein the tensile strain from the electron transit layer to the electron supply layer, compressive strain from the passivation film to the electron supply layer, and compressive strain from the passivation film to the electron transit layer lower a concentration of a 2D electron gas generated within the electron transit layer, and
wherein the compressive strain from the passivation film is applied to the electron transit layer.

14. The method of claim 13, comprising, before forming the insulating layer, forming a plate film on the passivation film,
wherein forming the gate opening part comprises etching the insulating layer and the plate film from an etching region including a region facing at least a portion of the plate film to form a first opening part and selectively removing the passivation film in a lower portion of the first opening part to form a second opening part communicating with the first opening part, and
wherein forming the drain electrode comprises forming the drain electrode on the electron supply layer so as to have the plate film interposed between the gate electrode and the drain electrode.

* * * * *